United States Patent [19]

Lur et al.

[11] Patent Number: 5,599,746
[45] Date of Patent: Feb. 4, 1997

[54] METHOD TO ELIMINATE POLYCIDE PEELING AT WAFER EDGE USING EXTENDED SCRIBE LINES

[75] Inventors: Water Lur, Taipei; Der-Yuan Wu, Tour Fenn Jenn, both of Taiwan

[73] Assignee: United Microelectronics Corporation, Hsin-Chu, Taiwan

[21] Appl. No.: 239,229

[22] Filed: May 6, 1994

[51] Int. Cl.$^6$ .................................................. H01L 21/28
[52] U.S. Cl. ............................ 437/200; 437/193; 437/226; 437/977
[58] Field of Search ................................. 437/226, 227, 437/200, 946, 977, 193; 148/DIG. 138; 257/755

[56] References Cited

U.S. PATENT DOCUMENTS

| | | | |
|---|---|---|---|
| 3,615,956 | 10/1971 | Irving et al. | 437/226 |
| 3,739,463 | 6/1973 | Aird et al. | 437/226 |
| 4,610,079 | 9/1986 | Abe et al. | 437/227 |

FOREIGN PATENT DOCUMENTS

| | | | |
|---|---|---|---|
| 03096236 | 4/1991 | Japan | 437/977 |

OTHER PUBLICATIONS

S. Wolf, "Silicon Processing For the VLSI Era, vol. I," Lattice Press, 1986, pp. xxiii–xxiv.

Primary Examiner—George Fourson
Assistant Examiner—Thomas G. Bilodeau
Attorney, Agent, or Firm—Meltzer, Lippe, Goldstein, et al.

[57] ABSTRACT

A method for eliminating the peeling of polycide at the edge of a wafer used to fabricate semi-conductors and integrated circuits. A global rough surface is formed on the wafer. The rough surface on the substrate wafer releases most of the thermal stress between the silicide and polysilicon layers which are found in conventional devices. A "peel free" surface results and the particle problem is lessened.

5 Claims, 3 Drawing Sheets

METHOD TO ELIMINATE POLYCIDE PEELING AT WAFER EDGE USING EXTENDED SCRIBE LINES

FIELD OF THE INVENTION

The present invention relates to a method and structure for eliminating the peeling of polycide at the edge of a wafer during VLSI fabrication.

BACKGROUND OF THE INVENTION

FIG. 1 schematically illustrates a conventional VLSI wafer. The wafer 10 of FIG. 1 comprises a plurality of die regions 20 which are separated by scribe lines 30 and 40. After the fabrication steps of the wafer are completed, the wafer is cut along the scribe lines to separate the individual dies. The individual dies are then mounted and packaged so that they can be used in their intended environments. On the conventional wafer the edges of the wafer are left unpatterned and smooth.

The back-end of the VLSI wafer fabrication process involves the deposition of a plurality of dielectric and/or conducting layers on the wafer surface. For example, the wafer may comprise a plurality of dies each of which is a buried-bit-line ROM. In this case, the back-end processes involve the depositing of passivation layers which are dielectrics such as BPSG (Borophosphosilicate glass) and metalization layers.

A polycide process has been widely used in the fabrication of VLSI circuits to reduce the resistance of local interconnects and improve device performance. The matured polycide structure is a thin LPCVD (Low Pressure Chemical Vapor Deposition) silicide deposited on a polysilicon layer during fabrication of the device. The thin polycide is typically $WSi_x$, where x is greater than 2 (x >2). Inevitably, an interfacial native oxide is formed between the LPCVD silicide and the underlying polysilicon. The native oxide will degrade the adhesion of the silicide to the polysilicon. The silicide layer of the polycide structure becomes easy to peel off from the polysilicon layer at the edges of the silicon wafer where no dies have been patterned. This silicide peeling significantly decreases the yield of devices during manufacture.

In addition, there exists tremendous stress after the silicide is deposited. The stress increases With each subsequent thermal treatment. The thermal coefficients of expansion for silicide and polysilicon are quite different. It is a major issue to generate thermal stress in the subsequent thermal treatments.

Further, the back-end layers always generate a tremendous stress on the substrate and result in the polycide peeling problem. The polycide peeling makes patterning of the back-end layers difficult and generates many particles which kill the yield. The polycide peeling problem is illustrated in FIGS. 2(a) and (b). At the edge 60 of the wafer 10, the silicide film 50 peels off the polysilicon layer 70 release the thermal stress. The pattern of the conventional wafers does not cover the entire wafer surface 10.

Conventionally, in order to obtain a higher deposition rate and lower resistance, the silicide layer is usually deposited to be of low resistivity, i.e., less silicon rich. In fact, the resistivity of silicide is one tenth (1/10) the resistivity of polysilicon. This is problematic because less silicon rich silicide causes more stress.

It is an object of this invention to provide a silicide on a wafer which does not peel.

It is another object of this invention to provide a device which has low resistivity and high speed.

SUMMARY OF THE INVENTION

To solve the polycide peeling problem in accordance with the invention, it should first be noted that the smooth edges of the conventional wafer contribute greatly to the peeling of the polycide.

Thus, in accordance with the present invention, the polycide peeling is substantially eliminated by making the entire surface of the wafer rough prior to the deposition of the polycide. The entire wafer is exposed to a dense pattern to create this rough surface. At any point in the process prior to the deposition of the polycide, the edges of the wafer are filled in with a pattern, thereby, creating a rough surface which is a better surface for the relaxation of stress and, hence, the adherence of the polycide.

In one embodiment of the invention a fabrication process is provided which comprises the following steps: Forming a rough surface over a wafer to the edges of said wafer prior to deposition of a polysilicon layer. For example, the rough surface is formed by depositing a densely patterned mask layer over the wafer and etching the wafer to form a rough surface.

In another embodiment of the invention a process is provided which comprises the following steps: Forming a pattern of dies on a portion of the surface of a wafer. Separating the dies by a first plurality of scribe lines and a second plurality of scribe lines orthogonal to the first plurality of scribe lines. At some point in the fabrication process, prior to deposition of the polycide layer, extending the pattern of dies and the first and second pluralities of scribe lines to the edges of the wafer. The scribe lines may be extended by masking and etching said wafer using a densely patterned mask. The dies created by this "extension" are fictitious, that is no devices will be formed on them.

In another embodiment, a wafer is provided. The wafer comprises a global rough surface which extends to the edges of the wafer. The rough surface can be scribe lines and a pattern of fictitious dies.

DETAILED DESCRIPTION OF THE PRESENT INVENTION

Figure 1:
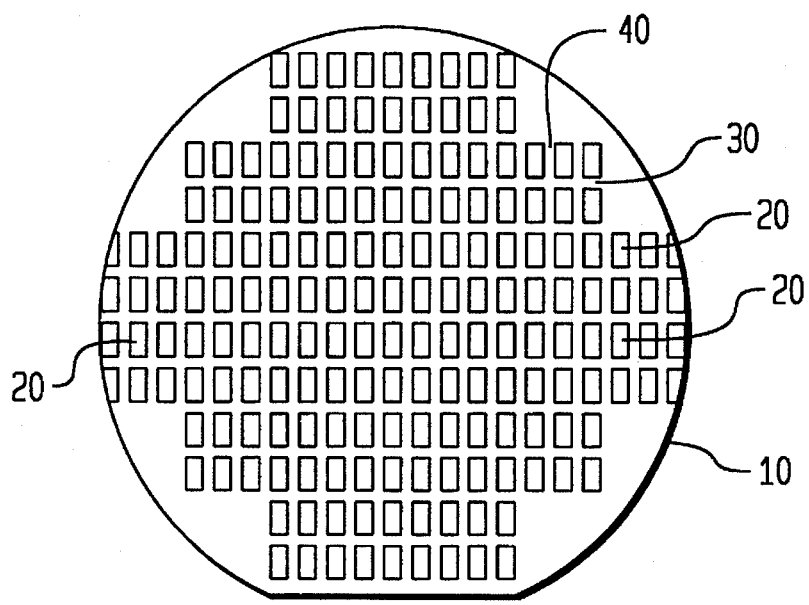
FIG. 1 illustrates the patterning of a conventional wafer.
Figure 3:
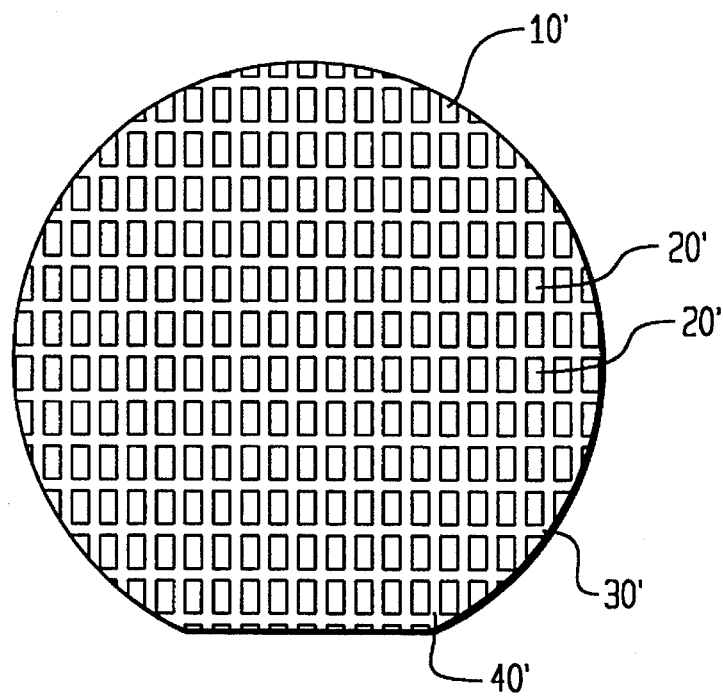
FIG. 3 illustrates a wafer of the present invention.
Figure 2A:
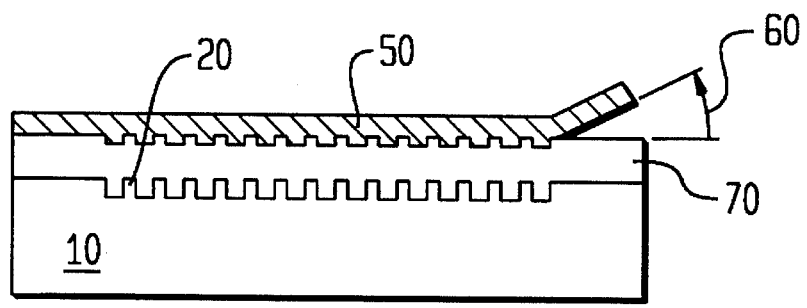
FIG. 2a illustrates peeling of a polycide layer from a conventional wafer edge.
Figure 2B:
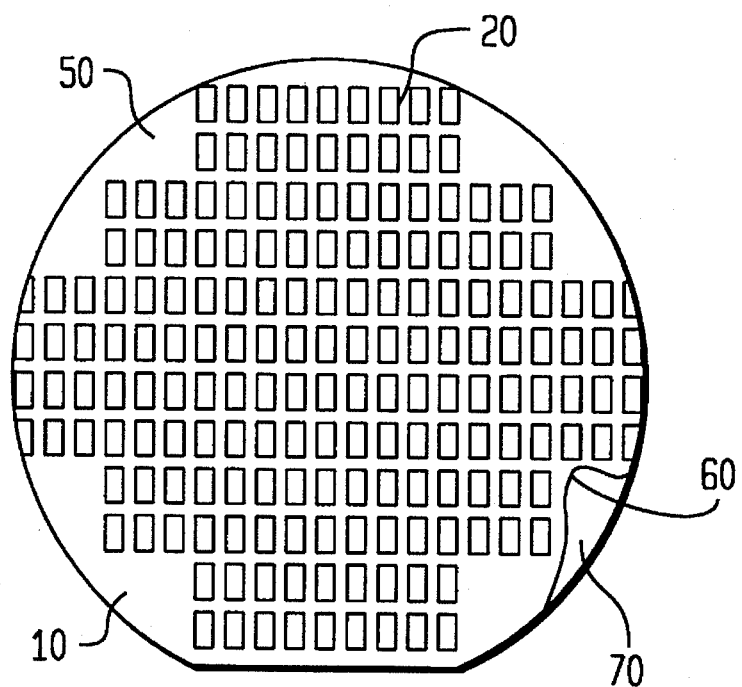
FIG. 2b is a photo of an actual wafer which illustrates the peeling of the polycide from the conventional wafer edge.

FIG. 3 illustrates a wafer 10' in accordance with an illustrative embodiment of the present invention. The wafer 10' is illustratively made of silicon. The wafer 10' comprises a plurality of die regions 20'. The die regions 20' are separated by scribe lines 30' and 40'. In contrast to FIG. 1, the pattern of die regions 20' of the inventive wafer cover the entire surface area of the wafer 10'. An intended rough surface is formed by these regions over the entire surface of the wafer.

The rough surface is formed at any point in the VLSI fabrication before a desired silicide and polysilicon layers are deposited. A mask with a dense pattern is used to expose the entire wafer including the edges which results in a global roughness.

Figure 4A:
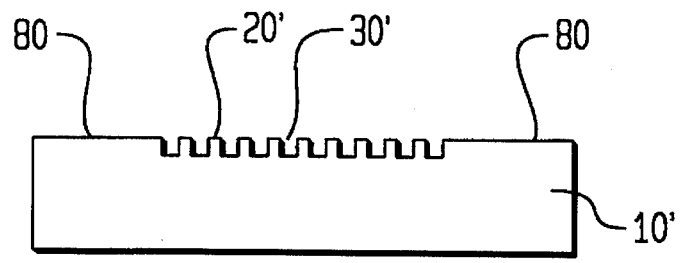
FIGS. 4(a) to (c) illustrate a process of the present invention.
Figure 4B:
Figure 4C:
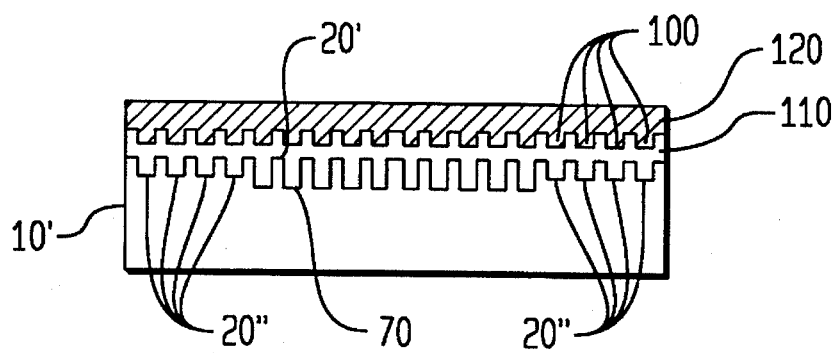

This process is illustrated in FIGS. 4(a) to 4(c). FIG. 4(a) illustrates a cross-section of the wafer 10' prior to deposition of a polysilicon layer and a polycide layer. The wafer 10' has dies 20' where the devices, e.g., ROMs, are being formed. These dies are separated by scribe lines 30'. The wafer 10' is smooth and unpatterned at the edges 80. Referring to FIG. 4(b), a densely patterned mask 90, is deposited over the wafer 10'. The wafer is then patterned and etched using the mask 90 to form a global roughness, as shown in FIG. 4(c), where 100 indicates the roughness added to edges 80 of the wafer. These rough areas 100 can be the scribe lines and the pattern of dies extended, in both directions, over the entire surface of the wafer to its edges. The extended dies 60" are fictitious in that no devices are formed on them. Finally, a layer of polysilicon 110 is deposited over the rough surface and then a layer of silicide 120 is deposited.

Although the entire wafer is patterned, the device is not manufactured to the wafer edge. Only this one layer is patterned, so that a rough surface to the edge of the wafer is created. This avoids the peeling and stress problems. The global rough surface increases the adherence of the silicide to the polysilicon.

This rough substrate wafer releases most of the thermal stress between the silicide and polysilicon layers. A "peel free" surface results and the particle problem is lessened.

Finally, the above described embodiment of the present invention is intended to be illustrative only. Numerous alternative embodiments may be devised by those of skilled in the art without departing from the spirit and scope of the following claims.

We claim:

1. A process for making semiconductor devices on a wafer to achieve adherence of a silicide layer to a polysilicon layer over the entire surface of the wafer comprising the steps of:

forming on a surface of said wafer a first group of die regions separated by a first group of scribe lines and a second group of die regions separated by said scribe lines, said first and second groups of die regions and said scribe lines occupying said entire surface of said wafer, said first group of die regions containing semiconductor devices and said second group of die regions containing no semiconductor devices and being formed to enable said silicide layer to be subsequently deposited to adhere over the entire surface of said wafer, depositing a layer of polysilicon over the entire surface of said wafer over said first and second groups of die regions and, depositing said silicide layer on the entire surface of said wafer over said polysilicon layer, said silicide layer adhering to said polysilicon layer over the entire surface of said wafer.

2. The method of claim 1 wherein said forming step, at a point in the process of forming said first group of die regions, comprises the steps of:

forming said second group of die regions by depositing a single layer of material on a portion of said wafer surface to be occupied by said second group of die regions, and patterning said single layer to form said scribe lines which separate said die regions in said second group.

3. The method of claim 2 wherein the step of forming said second group of die regions forms said second group of die regions near an edge of said wafer.

4. The method of claim 1 wherein said forming step, at a point in the process of forming said first group of die regions, comprises the steps of:

forming said second group of die regions by depositing a patterned mask on said wafer, and etching said wafer to form said scribe lines which separate said die regions in said second group.

5. The method of claim 1 wherein said forming step, at a point in the process of forming said first group of die regions, comprises forming said second group of die regions by masking and etching said wafer using a patterned mask.

* * * * *